(12) United States Patent
Hosomi et al.

(10) Patent No.: US 6,828,785 B2
(45) Date of Patent: Dec. 7, 2004

(54) MAGNETO-RESISTIVE EFFECT ELEMENT, MAGNETIC SENSOR USING MAGNETO-RESISTIVE EFFECT, MAGNETIC HEAD USING MAGNETO-RESISTIVE EFFECT AND MAGNETIC MEMORY

(75) Inventors: Masanori Hosomi, Miyagi (JP); Atsushi Matsuzono, Kanagawa (JP)

(73) Assignee: Sony Corporation, Tokyo (JP)

( * ) Notice: Subject to any disclaimer, the term of this patent is extended or adjusted under 35 U.S.C. 154(b) by 257 days.

(21) Appl. No.: 10/157,605

(22) Filed: May 29, 2002

(65) Prior Publication Data
US 2003/0011364 A1 Jan. 16, 2003

(30) Foreign Application Priority Data
May 29, 2001 (JP) ..................................... P2001-161017

(51) Int. Cl.[7] .......................... G01R 33/02; G11B 5/39
(52) U.S. Cl. ........................................ 324/252; 360/314
(58) Field of Search .......................... 324/252; 360/324, 360/324.1, 324.11, 324.12, 314, 315; 365/158, 171, 173

(56) References Cited
U.S. PATENT DOCUMENTS 6,351,408 B1 * 2/2002 Schwarzl et al. ............. 365/158
6,436,526 B1 * 8/2002 Odagawa et al. ............. 428/332
6,680,827 B2 * 1/2004 Li et al. ....................... 360/314
6,700,760 B1 * 3/2004 Mao ......................... 360/324.2

* cited by examiner

Primary Examiner—Bot LeDynh
(74) Attorney, Agent, or Firm—Sonnenschein, Nath & Rosenthal LLP

(57) ABSTRACT

A giant magneto-resistive effect element includes a lamination layer structure portion (10) in which at least a free layer (4) the magnetization of which is rotated in response to an external magnetic field, a fixed layer (2), an antiferromagnetic layer (1) for fixing the magnetization of the fixed layer (2) and a nonmagnetic layer (3) interposed between the free layer (4) and the fixed layer (2) are laminated one on top of another. A sense current flows to substantially a lamination layer direction of the lamination layer structure portion (10) and the lamination layer structure portion (10) has disposed thereon an electric conduction restricting layer (S) in which very small electric conduction areas are dispersedly formed across a path of said sense current, whereby an element resistance can be increased and the amount of magneto-resistance change can be increased. Thus, a magneto-resistive effect element, a magnetic sensor using magneto-resistive effect, a magnetic head using magneto-resistive effect and a magnetic memory become able to increase the amount of magneto-resistive change.

21 Claims, 11 Drawing Sheets

60

MAGNETO-RESISTIVE EFFECT ELEMENT, MAGNETIC SENSOR USING MAGNETO-RESISTIVE EFFECT, MAGNETIC HEAD USING MAGNETO-RESISTIVE EFFECT AND MAGNETIC MEMORY

RELATED APPLICATION DATA

The present application claims priority to Japanese Application(s) No(s). P2001-161017 filed May 29, 2001, which application(s) is/are incorporated herein by reference the extent permitted by law.

BACKGROUND OF THE INVENTION

1. Field of the Invention

The present invention generally relates to magneto-resistive effect devices, and particularly to a magneto-resistance effect element effectively utilizing a giant magneto-resistive effect (GMR effect) having what might be called a spin-valve configuration, a magnetic sensor using magneto-resistive effect, a magnetic head using magneto-resistive effect and a magnetic memory.

2. Description of the Related Art

In general, a magnetic sensor comprised of a magneto-resistive effect element and a magnetic head using such a magnetic sensor as a magnetic sensing portion are widely employed as a transducer to read out a magnetic field of a recorded signal from a magnetic recording medium, for example, at large linear density.

Magneto-resistive effect elements according to the related-art generally make effective use of an anisotropic magneto-resistive effect in which a resistance of a magneto-resistive effect element changes in proportion to a square of a cosine of an angle formed between the magnetization of the element and the direction in which a sense current, which flows through the element, is conducted.

In recent years, magneto-resistive effect elements using a magneto-resistive effect based upon a GMR (giant magneto-resistive) effect, in particular, a spin-valve effect in which a resistance change of an element through which a sense current is flowing is generated due to a spin-dependence of electric conduction electrons between magnetic layers disposed through a nonmagnetic layer and a spin-dependence scattering that occurs at the interfaces of respective layers have become popular increasingly.

Since the magneto-resistive effect element using the magneto-resistive effect based upon this spin-valve effect (hereinafter simply referred to as an "SV type GMR element") can exhibit a resistance change larger than that of the above-mentioned magneto-resistive effect element using the anisotropic magneto-resistive effect, the SV type GMR element is able to make up a highly-sensitive magnetic sensor and a highly-sensitive magnetic head.

In order to record data on a magnetic recording medium at a recording density up to about 50 gigabytes/inch$^2$, a magnetic head using a magneto-resistive effect element as a magnetic sensing portion may have a configuration which is what might be called a CIP (current in-plane) configuration in which a sense current flows to the plane direction of a thin film. However, when it is requested that data should be recorded on a magnetic recording medium at higher recording density, e.g., recording density of 100 gigabytes/inch$^2$, it is requested that a track width should be reduced to a track width of approximately 0.1 $\mu$m. According to the above-mentioned CIP configuration, even when the latest dry process is effectively utilized as a present patterning technique to manufacture magneto-resistive effect element, there is a limitation on forming such magneto-resistive effect element which can realize the above-mentioned high recording density and which can also realize the above-mentioned narrow track width. Furthermore, according to the above-mentioned CIP configuration, since it is necessary that a resistance should be lowered, a cross-sectional area of a current path has to be increased. As a result, there is a limitation on making such a narrow track width.

On the other hand, in the SV type GMR element, there has been proposed a GMR element having a configuration which is what might be called a "cPP (current perpendicular to plane) configuration in which a sense current flows in the direction perpendicular to the film plane.

A TMR (tunnel magneto-resistive) element using a tunnel current has been examined, and in recent years, spin-valve elements and multilayer film type elements have been examined (e.g., see Japanese patent translation No 11-509956, Japanese laid-open patent application No. 2000-30222, Japanese laid-open patent application No. 2000-228004 and The Abstract of the Lectures of the 24th Meeting of The Society for Applied Magnetics of Japan 2000, page 427).

Since the GMR element having the CPP configuration allows the sense current to flow in the direction perpendicular to the film plane as described above, this giant magneto-resistive effect element cannot exhibit a sufficiently high sensitivity when it is applied to the spin-valve type film configuration having the CIP configuration in which a sense current flows in the direction extending along the film plane. The reason for this will be described below. That is, while the giant magneto-resistive effect element having the CIP configuration utilizes a resistance change caused by a spin-dependence scattering that occurs when a sense current flows mainly in the direction parallel to an electrical conduction layer in the spin-valve type film configuration and to the interface of the electrical conduction layer, when the giant magneto-resistive effect element has the CPP configuration, a sense current flows in the direction perpendicular to the film plane with the result that this effect cannot act effectively.

On the other hand, according to the reports, it is to be understood that the resistance change could be improved in accordance with the increase of the thickness of the free layer in the spin-valve configuration (see the above-mentioned Abstract of the Lectures of The Society for Applied Magnetics of Japan).

However, since a distance in which electric conduction electrons are able to continue spinning is limited, a resistance change cannot be improved sufficiently by increasing the thickness of the free layer.

Furthermore, in order to increase the sensitivity of the magneto-resistive effect element serving as the magnetic head, it is necessary that a product of a saturated magnetization Ms of a free layer and a film thickness t, i.e., a value of Ms×t should be decreased. Accordingly, it is to be appreciated that the above-mentioned method of improving the resistance change by increasing the film thickness of the free layer is not a present essential solution for realizing high recording density, very small recording and reproducing bits and high sensitivity.

SUMMARY OF THE INVENTION

In view of the aforesaid aspects, it is an object of the present invention to provide a magneto-resistive effect element which can be made high in sensitivity by increasing an element resistance.

It is another object of the present invention to provide a magneto-resistive effect element which are able to realize a high recording density and to microminiaturize recording and reproducing bits when it is applied to a process for processing a moving picture having a long play time.

It is still another object of the present invention to provide a magnetic sensor using magneto-resistive effect and a magnetic head using magneto-resistive effect using this magneto-resistive effect element which can read out recorded signals from the above very small areas at high sensitivity.

It is a further object of the present invention to provide an electromagnetic transducer element for a magnetic memory, i.e., a memory element in which data can be recorded at high recording density with high accuracy.

According to an aspect of the present invention, there is provided a spin-valve type giant magneto-resistive effect element (SV type GMR element) having a CPP (current perpendicular to plane) type configuration including a lamination layer structure portion in which at least a free layer the magnetization of which is rotated in response to an external magnetic field, a fixed layer, an antiferromagnetic layer for fixing the magnetization of the fixed layer and a nonmagnetic layer interposed between the free layer and the fixed layer are laminated one on top of another and in which a sense current flows to substantially a lamination layer direction of the lamination layer structure portion.

In particular, the above-mentioned lamination layer structure portion has disposed thereon an electric conduction restricting layer in which very small electric conduction areas are dispersedly formed across a path of the sense current in the CPP type configuration.

The electric conduction restricting layer is disposed at the other position than an interface between the layers of the lamination layer structure portion, i.e., on both major surfaces of the lamination layer direction of the lamination layer structure portion or inside the free layer, the fixed layer and the antiferromagnetic layer over the whole regions of the electric conduction path along these layer surfaces.

According to another aspect of the present invention, a magnetic sensor using magneto-resistive effect according to the present invention includes the above-mentioned magneto-resistive effect element according to the present invention.

More specifically, there is provided a magnetic sensor using magneto-resistive effect including a magneto-resistive effect element, the magneto-resistive effect element including a lamination layer structure portion in which at least a free layer the magnetization of which is rotated in response to an external magnetic field, a fixed layer, an antiferromagnetic layer for fixing the magnetization of the fixed layer and a nonmagnetic layer interposed between the free layer and the fixed layer are laminated one on top of another and in which a sense current flows to substantially a lamination layer direction of the lamination layer structure portion. According to this magnetic sensor using magneto-resistive effect, the lamination layer structure portion has disposed thereon an electric conduction restricting layer in which very small electric conduction areas are distributed across a path of the sense current.

In accordance with a further aspect of the present invention, a magnetic head using magneto-resistive effect according to the present invention includes the magneto-resistive effect element according to the present invention as its magnetic sensing portion.

More specifically, there is provided a magnetic head using magneto-resistive effect in which a magneto-resistive effect element is disposed between first and second magnetic shields, the magneto-resistive effect element is a giant magneto-resistive effect element including a lamination layer structure portion in which at least a free layer the magnetization of which is rotated in response to an external magnetic field, a fixed layer, an antiferromagnetic layer for fixing the magnetization of the fixed layer and a nonmagnetic layer interposed between the free layer and the fixed layer are laminated one on top of another and in which a sense current flows to substantially a lamination layer direction of the lamination layer structure portion. According to this magnetic head using magneto-resistive effect, the lamination layer structure portion has disposed thereon an electric conduction restricting layer in which very small electric conduction areas are distributed across a path of the sense current.

In accordance with yet a further aspect of the present invention, there is provided a magnetic memory which is comprised of a bit line, a word line and a memory element disposed in response to an intersection at which the bit line and the word line cross each other. In this magnetic memory, the memory element is comprised of a giant magneto-resistive effect element including a lamination layer structure portion in which at least a free layer the magnetization of which is rotated in response to an external magnetic field, a fixed layer, an antiferromagnetic layer for fixing the magnetization of the fixed layer and a nonmagnetic layer interposed between the free layer and the fixed layer are laminated one on top of another and in which a sense current flows to substantially a lamination layer direction of the lamination layer structure portion and the lamination layer structure portion has disposed thereon an electric conduction restricting layer in which very small electric conduction areas are dispersedly formed across a path of the sense current.

The SV type GMR element having the CPP type configuration according to the present invention can increase an element resistance sufficiently, can increase a resistance change amount and can improve sensitivity while a resistance change ratio can be maintained.

DESCRIPTION OF THE PREFERRED EMBODIMENTS

First, a magneto-resistive effect element according to the present invention will be described.

A magneto-resistive effect element according to the present invention is an SV type GMR having a CPP type configuration as mentioned before and has a lamination layer structure portion in which there are laminated at least a free layer the magnetization of which is rotated in response to an external magnetic field, a fixed layer, an antiferromagnetic layer for fixing a magnetization of this fixed layer and a nonmagnetic layer interposed between the free layer and the fixed layer. This lamination layer structure portion may include electric conduction restricting layers in which pinhole-like or net-like very small conducting areas of opposite patterns are dispersedly formed across an electric conduction path of a sense current.

Further, when a flux guide layer is disposed in such a manner that it may be magnetically combined with the free layer, in this flux guide layer and/or on a surface of the flux guide layer that is opposite to the free layer may be disposed electric conduction restricting layers in which hole-like or net-like very small conducting areas of opposite patterns are similarly dispersedly formed across an electric conduction path of a sense current.

With respect to the number of the electric conduction restricting layers, there may be disposed not less than one electric conduction restricting layer, e.g., a plurality of electric conduction restricting layers. In actual practice, when the sum total of the number of the electric conduction restricting layers increases excessively, it becomes impossible to apply a magneto-resistive effect element to a magnetic head using magneto-resistive effect.

In actual practice, an element resistance of a CPP type GMR element should be less than 700 m$\Omega \cdot \mu m^2$ because the CPP type GMR element has many restrictions imposed thereon when it is in use.

SV type GMR elements according to the embodiments of the present invention will be described below with reference to FIGS. 1A, 1B to FIGS. 4A, 4B. Throughout FIGS. 1A, 1B to 4A, 4B, FIGS. 1A to 4A are cross-sectional views showing fundamental configurations of SV type GMR elements according to the embodiments of the present invention, and FIGS. 1B to 4B are schematic cross-sectional views showing positions at which electric conduction restricting layers R are disposed in the above-mentioned configurations of the SV type GMR elements, respectively. Accordingly, in FIGS. 1B to 4B, all electric conduction restricting layers R need not always be disposed and at least electric conduction restricting layers R, of not less than one electric conduction restricting layer may be disposed.

Figure 1A:
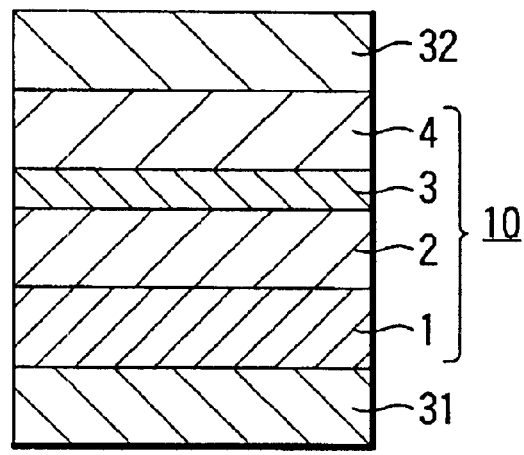
FIG. 1A is a schematic cross-sectional view showing a fundamental configuration of a magneto-resistive effect element according to the present invention.

FIG. 1A shows an example of an SV type GMR element having a configuration which is what might be called a bottom type configuration. In this case, FIG. 1A shows an example of an SV type GMR element in which a lamination layer structure portion 10 comprising an antiferromagnetic layer 1, a fixed layer 2, a nonmagnetic layer 3 and a free layer 4, each of which has conductivity, is deposited on a first electrode 31 and in which a second electrode 31 is disposed on the free layer 4.

Figure 1B:
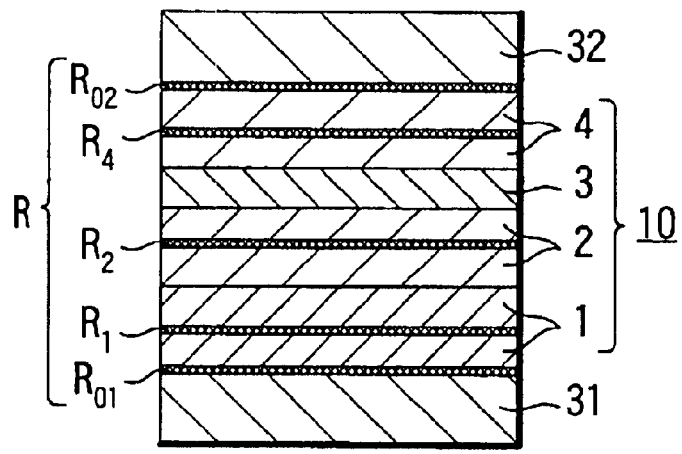
FIG. 1B is a schematic cross-sectional view showing an embodiment of a magneto-resistive effect element having the configuration shown in FIG. 1A.

According to the present invention, in the SV type GMR element having he above-mentioned configuration, for example, as shown in FIG. 1B, electric conduction restricting layers $R_{01}$ and S02 $R_{02}$ can be disposed on both the surfaces of this lamination layer structure portion 10, i.e., on a lower surface of the antiferromagnetic layer 1 and an upper surface of the free layer 4 in FIG. 1B. Further, electric conduction restricting layers $R_1$, $R_2$, $R_4$ can be disposed over the whole areas of the film planes within the antiferromagnetic layer 1, the fixed layer 2 and the free layer 4.

Figure 2A:
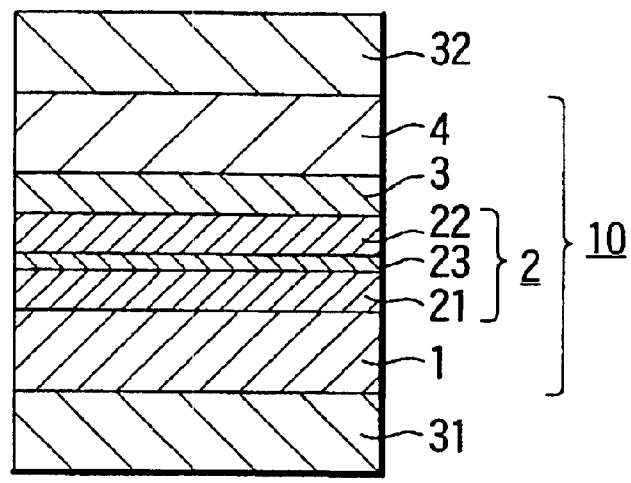
FIG. 2A is a schematic cross-sectional view showing a fundamental configuration of a magneto-resistive effect element according to the present invention.
Figure 2B:
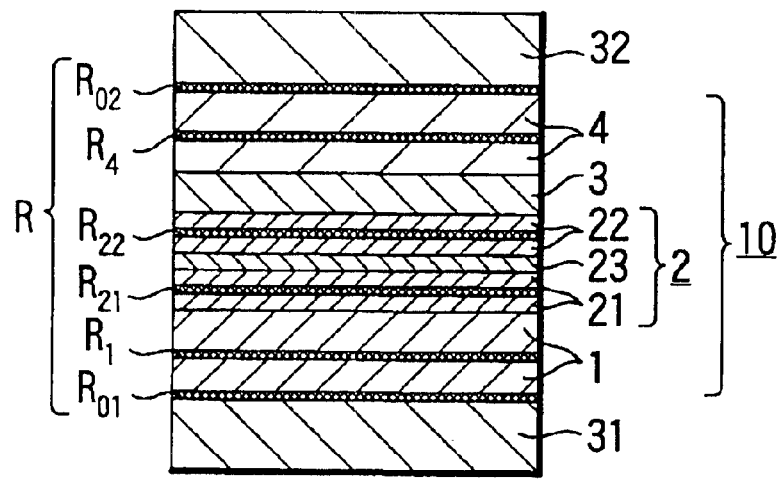
FIG. 2B is a schematic cross-sectional view showing another embodiment of a magneto-resistive effect element having the configuration shown in FIG. 2A.

In the embodiment of the magneto-resistive effect element shown in FIGS. 2A and 2B, the magneto-resistive effect element has a lamination layer ferri-magnetic layer structure, i.e., so-called synthetic configuration in which the fixed layer 2 shown in FIGS. 1A and 1B is comprised of bi-layer ferromagnetic layers 21 and 22 laminated one on top of another through a nonmagnetic interposed layer 23 as shown in FIG. 2A. In this case, electric conduction restricting layers $R_{21}$, $R_{22}$ can be disposed within the ferromagnetic layers 21 and 22.

Figure 3A:
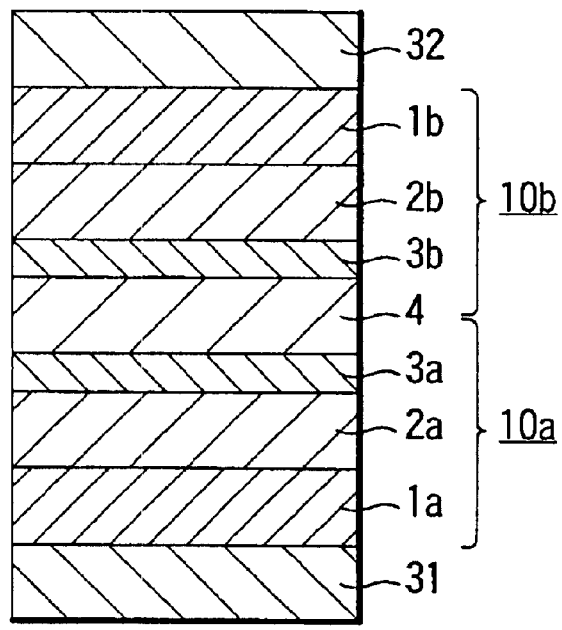
FIG. 3A is a schematic cross-sectional view showing a fundamental configuration of a magneto-resistive effect element according to the present invention.
Figure 3B:
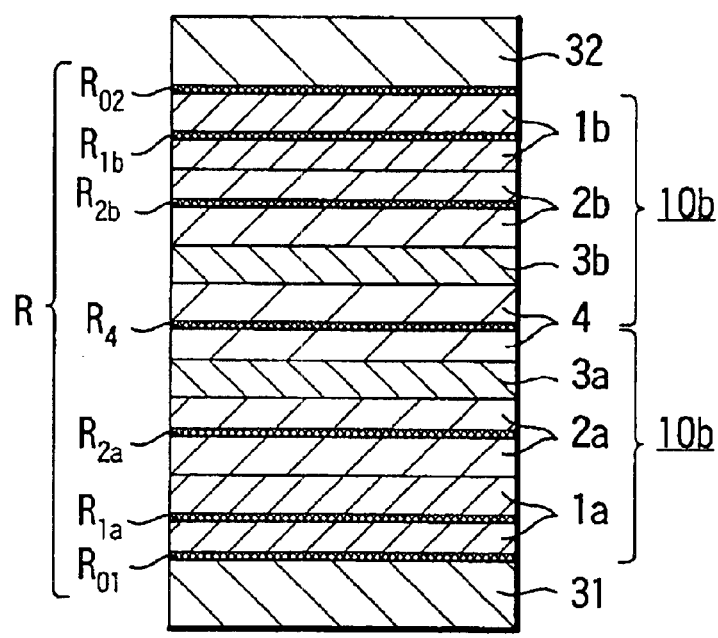
FIG. 3B is a schematic cross-sectional view showing further another embodiment of a magneto-resistive effect element having the configuration shown in FIG. 3A.

In the embodiment shown in FIGS. 3A and 3B, the magneto-resistive effect element has a so-called dual type configuration in which a first lamination layer structure portion 10a based upon a so-called bottom type SV type GMR comprising a first ferromagnetic layer 1a, a first fixed layer 2a, a first nonmagnetic layer 3a and a free layer 4 and a second lamination layer structure portion 10b based upon a top type SV type GMR in which a second nonmagnetic layer 3b, a second fixed layer 2b and a second antiferromagnetic layer 1b are laminated one on top of another are laminated as shown in FIG. 3A. The free layer 4 is made common to the first lamination layer structure portion 10a and the second lamination layer structure portion 10b.

Also in this case, electric conduction restricting layers $R_{O1}$ and $R_{O2}$ can be disposed on the lower surface and the upper surface on the opposite side of the boundary surfaces between the first ferromagnetic layers 1a and 1b of the lamination layer structure portions 10a and 10b and the respective fixed layers 2a and 2b. At the same time, electric conduction restricting layers $R_{1a}$ and $R_{1b}$ can be disposed on the first an second antiferromagnetic layers $1_a$ and $1_b$, and electric conduction restricting layers $R_{2a}$ and $R_{2b}$ can be disposed on the first and second fixed layers 2a and 2b.

Figure 4A:
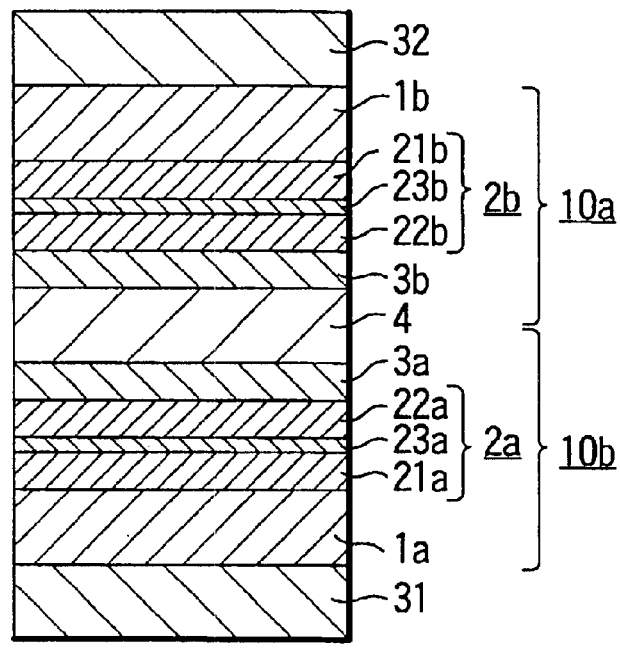
FIG. 4A is a schematic cross-sectional view showing a fundamental configuration of a magneto-resistive effect element according to the present invention.
Figure 4B:
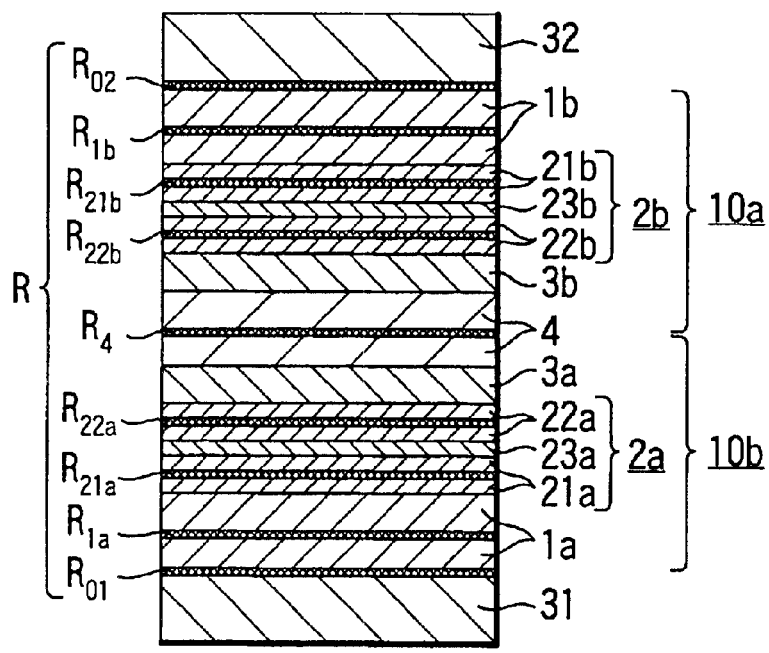
FIG. 4B is a schematic cross-sectional view showing yet another embodiment of a magneto-resistive effect element having the configuration shown in FIG. 4A.

Further, in the embodiment shown in FIGS. 4A and 4B, the magneto-resistive effect element has a synthetic configuration in which the first and second fixed layers 2a and 2b are comprised of respective bi-layer ferromagnetic layers 21a, 22a and 21b, 22b which are laminated one on top of another through nonmagnetic interposed layers 23a and 23b in the dual type configuration shown in FIGS. 3A and 3B. In this case, electric conduction restricting layers $R_{2a}$, $R_{2b}$ and electric conduction restricting layers $R_{22a}$, $R_{22b}$ can be disposed within the respective ferromagnetic layers 21a, 22a and 21b, 22b of the two fixed layers 2a and 2b.

In the above-mentioned respective embodiments, the magneto-resistive effect element may be formed as the CPP type configuration by allowing a sense current to flow through the first and second electrodes 31 and 32.

In FIGS. 2A, 2B to FIGS. 4A, 4B, elements and parts identical to those of FIGS. 1A and 1B are denoted by identical reference numerals and therefore need not be described in detail.

Furthermore, the SV type GMR element according to the present invention or the magnetic sensor using magneto-resistive effect and the magnetic head using magneto-resistive effect, each of which uses this SV type GMR element as a magnetic sensing portion thereof, may be modified as a flux guide structure including a conductive flux guide layer.

FIGS. 5 to 8 show the above-mentioned embodiments of the modified SV type GMR element, the modified magnetic sensor using magneto-resistive effect and the modified magnetic head using magneto-resistive effect, respectively.

In this flux guide structure, a flux guide layer 81 is magnetically combined to a free layer and a front end of this flux guide layer 81 is opposed to a forward surface 80 into which a detection magnetic field is introduced. That is, in the magnetic head using magneto-resistive effect, for example, the front end of the flux guide layer 81 is opposed to a contact surface by which the magnetic head using magneto-resistive effect is brought in contact with a magnetic recording medium. Alternatively, in a flying type magnetic head, for example, the front end of the flux guide layer 81 is opposed to a forward surface which serves as an ABS (air bearing surface).

According to this flux guide structure, since the lamination layer structure portions 10, 10a, 10b of the magneto-resistive effect element body are disposed at the positions retreated from the forward surface 80 and the detection magnetic field is introduced into the free layer 4 by the flux guide layer 81, it is possible to avoid shortening a service life of the magneto-resistive effect element and to avoid the occurrence of noises due to abrasion or friction heat generated when the magneto-resistive effect element body is brought in contact with a magnetic recording medium, for example.

Figure 5:
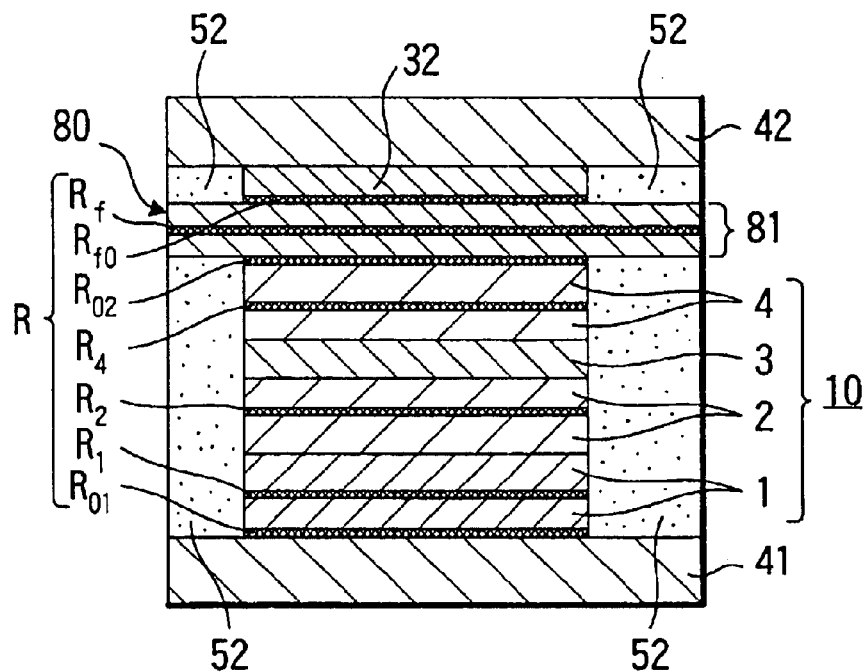
FIG. 5 is a schematic cross-sectional view showing a configuration of a magneto-resistive effect element, a magnetic sensor using magneto-resistive effect or a magnetic head using magneto-resistive effect according to an embodiment of the present invention.

An example shown in FIG. 5 illustrates the case of a magneto-resistive effect element, a magnetic sensor using magneto-resistive effect or a magnetic head using magneto-resistive effect in which the lamination layer structure potion 10 of the SV type GMR element body, which has been described so far with reference to FIG. 1B, is disposed between opposing first and second magnetic shield cum electrodes 41 and 42 at the position retreated from the forward surface 80 in the depth direction, the flux guide layer 81 is formed over at least part of the free layer 4 of this lamination layer structure portion 10, e.g., the whole surface and the front end of the flux guide layer 81 is opposed to the forward surface 80 to introduce a detection signal magnetic field into the free layer 4 through this flux guide layer 81.

In this case, similarly to the structure shown in FIG. 1B, electric conduct on restricting layers $R_f$, $R_{f0}$ which cross the whole of the electric conduction path of sense current in the flux guide layer 81, are disposed in the flux guide layer 81 and/or on the flux guide layer 81 at its surface opposite to the free layer 4.

In this case, in order that the sense current may flow through the lamination layer structure portion 10, a second electrode 32 is limitedly interposed between the flux guide layer 81 and the second magnetic shield cum electrode 42 at a corresponding portion on the lamination layer structure portion 10.

An insulating material 52 such as $Al_2O_3$ or $SiO_2$ is filled into the other portion between the first magnetic shield cum electrode 41 and the second magnetic shield cum electrode 42.

In FIG. 5, elements and part identical to those of FIG. 1B are denoted by identical reference numerals and therefore need not be described in detail.

Figure 6:
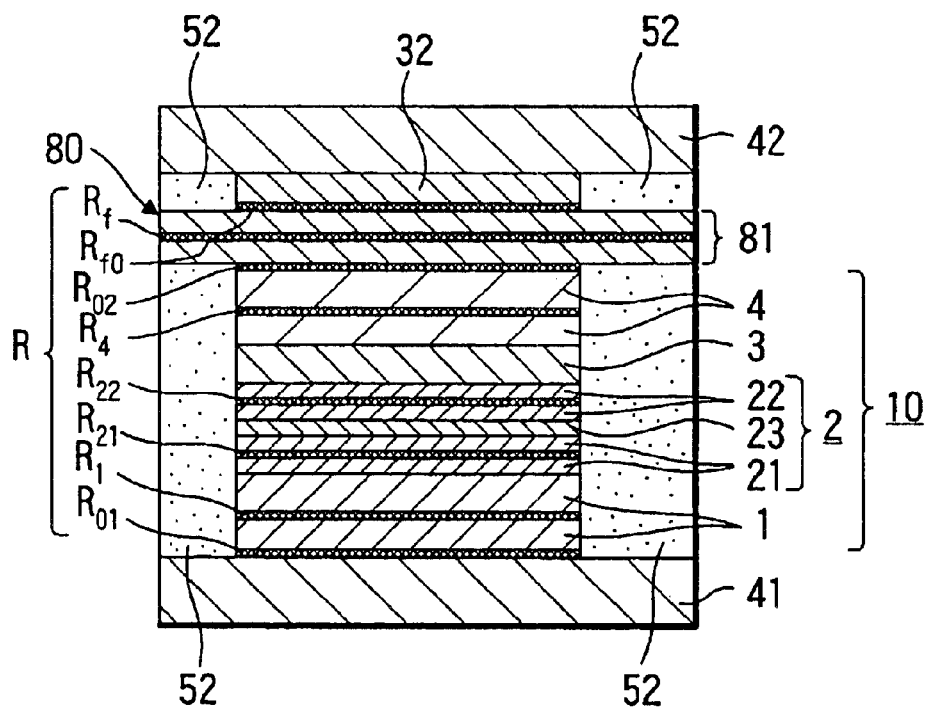
FIG. 6 is a schematic cross-sectional view showing a configuration of a magneto-resistive effect element, a magnetic sensor using magneto-resistive effect or a magnetic head using magneto-resistive effect according to another embodiment of the present invention.

An example shown in FIG. 6 shows the case of a magneto-resistive effect element, a magnetic sensor using magneto-resistive effect or a magnetic head using magneto-resistive effect in which the lamination layer structure potion 10 having the synthetic structure, which has been described so far with reference to FIG. 2B, is disposed between opposing the first magnetic shield cum electrode 41 and the second magnetic shield cum electrode 42 at the positions retreated from the forward surface 80 in the depth direction, the flux guide layer 81 is formed over at least part of, for example, the whole surface of the free layer 4 of this lamination layer structure portion 10 and the front end of this flux guide layer 81 is opposed to the forward surface 80 to introduce a detection signal magnetic field into the free layer 4 through the flux guide layer 81.

In FIG. 6, elements and parts identical to those of FIG. 2B are denoted by identical reference numerals and therefore need not be described in detail.

Figure 7:
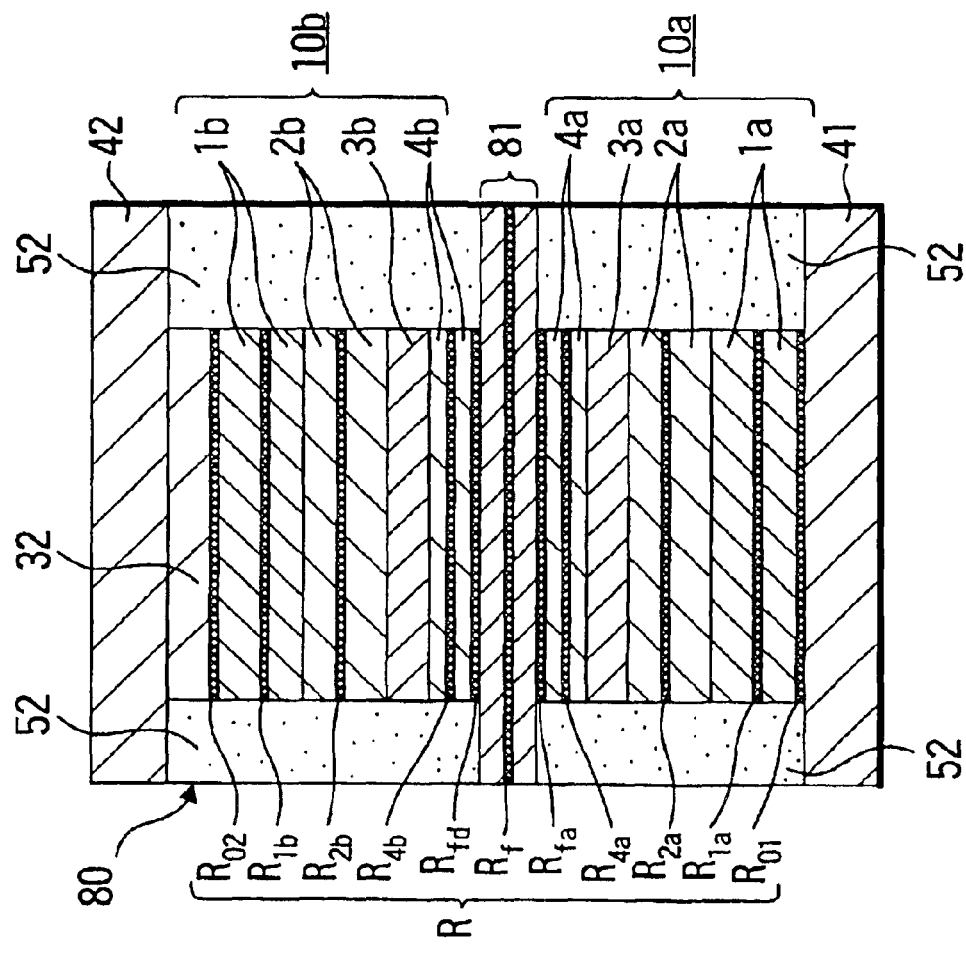
FIG. 7 is a schematic cross-sectional view showing a configuration of a magneto-resistive effect element, a magnetic sensor using magneto-resistive effect or a magnetic head using magneto-resistive effect according to further another embodiment of the present invention.

An example shown in FIG. 7 shows the case of a magneto-resistive effect element, a magnetic sensor using magneto-resistive effect or a magnetic head using magneto-resistive effect in which the lamination structure portions 10a and 10b having the dual type configuration, which have been described so far with reference to FIG. 3B, are disposed between the opposing the first magnetic shield cum electrode 41 and the second magnetic shield cum electrode 42. In this case, first and second free layers 4a and 4b are respectively disposed in the two lamination layer structure portions 10a and 10b, and the flux guide layer 81 is disposed between the first and second free layers 4a and 4b.

In this case, on the flux guide layer 81 side of the opposite side of the interface between the first and second nonmagnetic layers 3a and 3b, there can be provided electric conduction restricting layers $R_{fa}$ and $R_{fb}$ which cross the whole of the electric conduction path of the sense current. Furthermore, in the flux guide layer 81, there can be provided an electric conduction restricting layer $R_f$ which crosses the whole of the electric conduction path of the sense current.

Figure 8:
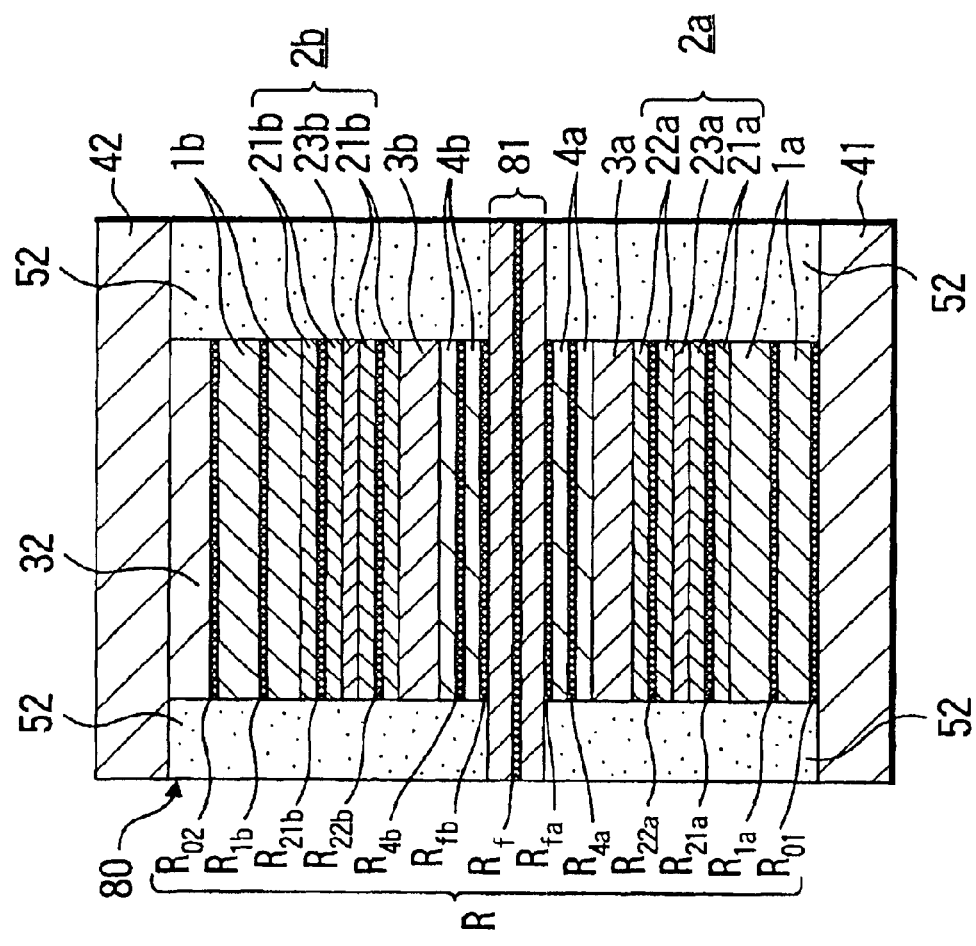
FIG. 8 is a schematic cross-sectional view showing a configuration of a magneto-resistive effect element, a magnetic sensor using magneto-resistive effect or a magnetic head using magneto-resistive effect according to a further embodiment of the present invention.

An example shown in FIG. 8 shows the case of a magneto-resistive effect element, a magnetic sensor using magneto-resistive effect or a magnetic head using magneto-resistive effect in which the lamination layer structure portions 10a and 10b having the synthetic structure, which have been described so far with reference to FIG. 4B, are disposed between the opposing the first magnetic shield cum electrode 41 and the second magnetic shield cum electrode 42 in a dual type configuration fashion.

In FIG. 8, elements and parts identical to those of FIG. 3B are denoted by identical reference numerals and therefore need not be described in detail.

Figure 11:
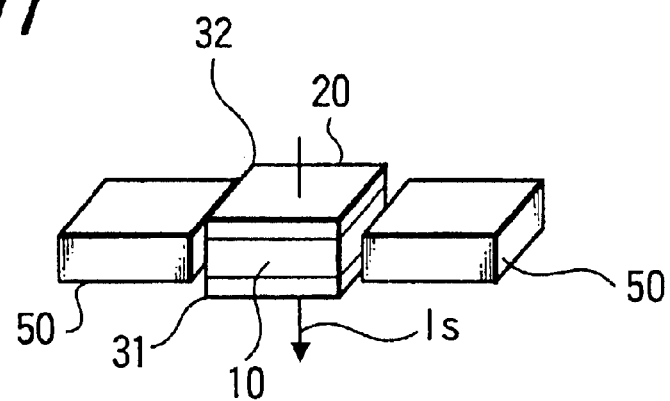
FIG. 11 is a schematic perspective view illustrating an example of a magnetic sensor or a magnetic head according to the present invention.

Then, as schematically shown in FIG. 11, hard magnetic layers 50, which are magnetized for applying a stabilization bias to the GMR elements 20 having the above-mentioned respective lamination layer structure portions shown in FIGS. 1A, 1B to FIGS. 4A, 4B so that the magnetization state crossing the detection magnetic field may be set under the condition that the detection magnetic field is not applied to its free layer (hereinafter referred to as a "no-magnetic field state") are disposed across the GMR element 20.

In the flux guide structures, which have been described so far with reference to FIGS. 5 to 8, the similar hard magnetic layers 50, for example, are disposed on both sides of the GMR element and the flux guide layer combined to the GMR element.

Magnetization directions of the fixed layers 2, 2a, 2b and the antiferromagnetic layers 1, 1a, 1b, which are combined with the fixed layers 2, 2a, 2b in a ferromagnetic exchange combination fashion, are set to the same direction which crosses the magnetization direction of the above-mentioned free layer in the no-magnetic field state.

Then, a detection magnetic field is applied to the lamination layer direction of the lamination layer structure portion along the direction perpendicular to (intersecting) the sense current $I_s$ and the bias magnetic field, and the resistance change generated by this detection external magnetic field is obtained as an electrical output by the sense current $I_s$.

Figure 9:
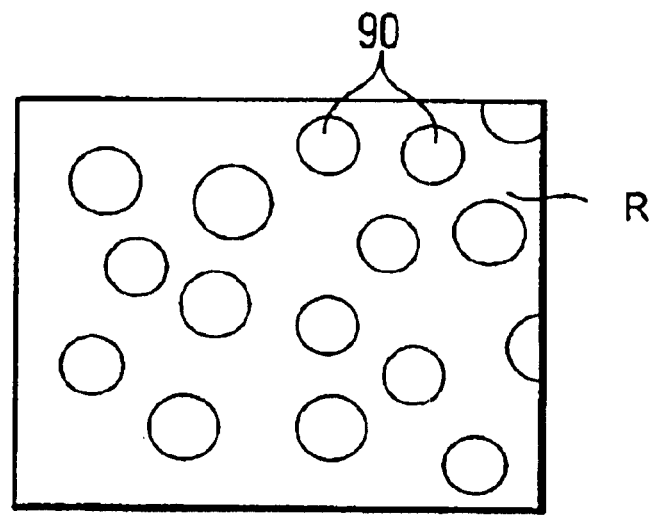
FIG. 9 is a schematic plan view illustrating an example of an electric conduction restricting layer according to the present invention.

When the electric conduction restricting layer R is formed of a thin-film insulating layer made of an insulating material having a thickness of approximately 4 angstroms which is an order of an atomic layer, as FIG. 9 shows a schematic plan view, very small electric conduction areas 90 are dispersed due to pin-holes generated by defects of the thin film.

Alternatively, when a very thin film of a conductive material layer such as Al is formed and oxidized in an anodic oxidation fashion, for example, there can be formed very small electric conduction areas 90 due to pin-holes generated by defects of the thin film.

Figure 10:
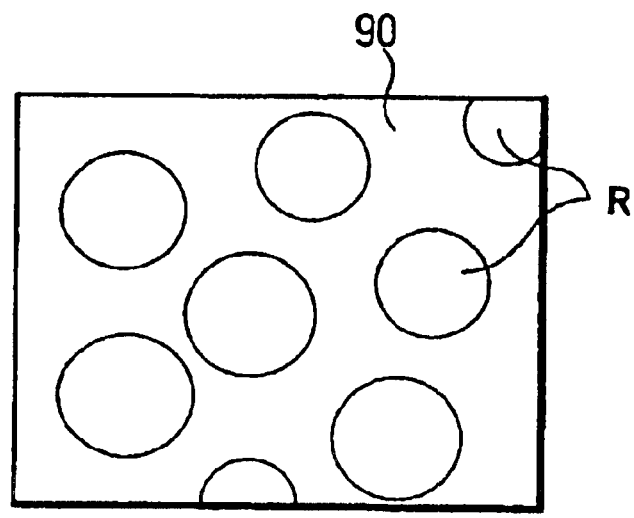
FIG. 10 is a schematic plan view illustrating another example of an electric conduction restricting layer according to the present invention.

While the electric conduction restricting layer R has the pin-holes formed thereon as the very small electric conduction areas 90 in the above-mentioned example shown FIG. 9, the present invention is not limited thereto, and an opposite pattern may be formed. As FIG. 10 shows a schematic plan view, for example, a very thin insulating material or a very thin high-resistance material is deposited by a suitable method such as sputtering and condensed deposition is generated on the deposited surface by a so-called wetting, whereby material layers are formed as dispersed layers. Thus, there can be produced a net-like very small electric conduction area 90.

Materials of this electric conduction restricting layer R may be Al, Mg, Cu, Si, Ti, W, Ta, Ru, CoFe, NiFe alloy, Cr alloy, Y, Zr, V, Mn, Fe, Co, Ni, Nb, Mo, Ag, Rh, Ir, rare-earth alloys and the like. Alternatively, materials of the electric conduction restricting layer R may be any one of oxide, nitride, carbide, boride and silicide of the above-mentioned materials or may be a plurality of alloys, a mixed layer and the like.

It is to be desired that a ratio of an area of the very small electric conduction area should be made less than 50%.

The antiferromagnetic layers 1, 1a, 1b in the above-mentioned respective SV type GMRs according to the present invention may be made of PtMn, NiMn, PdPtMn, Ir—Mn, Rh—Mn, Fe—Mn, Ni oxide, Co oxide, Fe oxide and the like.

The ferromagnetic layer of the fixed layer 2 may be formed of ferromagnetic layers made of Co, Fe, Ni or alloy of more than two materials or ferromagnetic layers made of a combination of different compositions, e.g., Fe and Cr ferromagnetic layers.

When the free layer 4 is made of a CoFe film, a NiFe film, a CoFeB film or a lamination layer film of the CoFe film, the NiFe film and the CoFeB film, e.g., CoFe/NiFe or CoFe/NiFe/CoFe film, it is possible to realize a larger MR ratio and a soft magnetic characteristic.

Nonmagnetic layers such as the nonmagnetic layers 3, 3a, 3b and the nonmagnetic interposed layers 23, 23a, 23b having the lamination layer ferri-magnetic layer structures may be made of Cu, Au, Ag, Pt and Cu—Ni, Cu—Ag, Ru, Cr, Rh and Ir.

FIG. 11 is a schematic perspective view of the magnetic sensor or the magnetic head according to the present invention. As shown in FIG. 11, across the above-mentioned magneto-resistive effect element according to the present invention, i.e., SV type GMR element 20, there are disposed the hard magnetic layers 50 magnetized to apply the stabilization magnetic field to the free layer 4 of the lamination layer structure portion 10 such that the magnetization direction of the free layer 4 may be set to the direction intersecting the detection magnetic field direction under the condition that the external detection magnetic field is not applied to the free layer 4, thereby allowing the sense current $I_s$ to flow in the lamination layer direction of the lamination layer structure portion 10.

Then, the sense current $I_s$ and an external magnetic field in the direction perpendicular to the bias magnetic field, i.e., a detection magnetic field H are applied to the lamination layer structure portion 10, and the resistance change generated by this external magnetic field is obtained as an electrical output by the sense current $I_s$.

Figure 12:
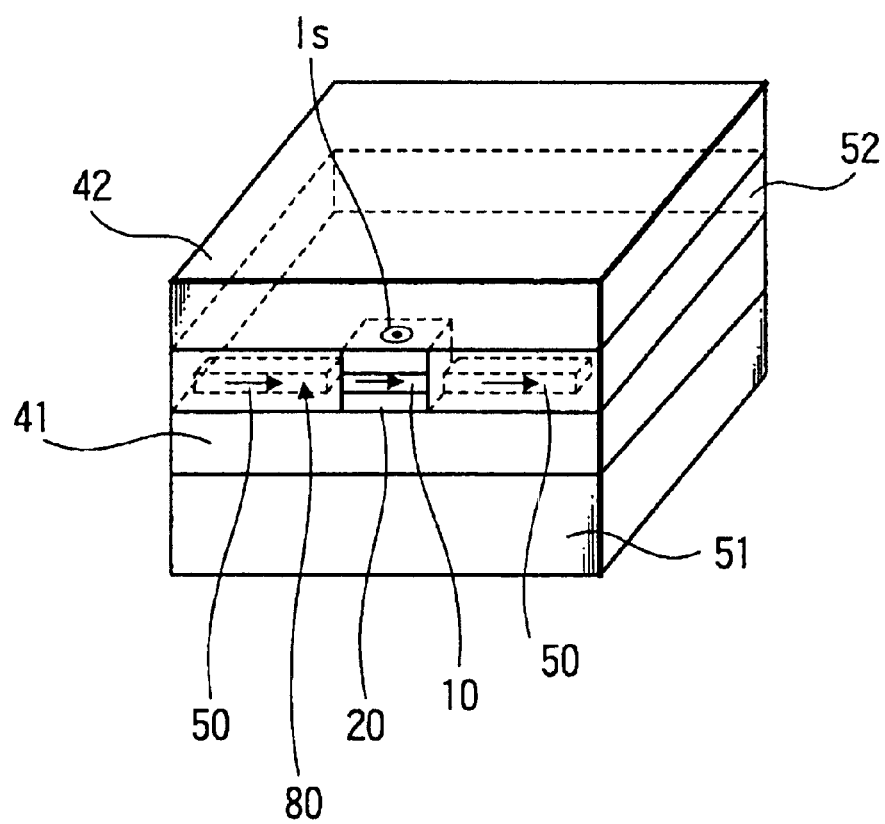
FIG. 12 is a cross-sectional perspective view illustrating another example of a magnetic sensor or a magnetic head according to the present invention.

FIG. 12 is a perspective view showing a magnetic head using magneto-resistive effect according to the present invention. As shown in FIG. 12, for example, on a substrate 51 made of a suitable material such as AlTiC, there is disposed the magnetic shield cum electrode layer 41, on which, as explained in FIG. 11, for example, are disposed the GMR element and the hard magnetic layers 50 that is used to apply the stabilization bias on both sides of the GMR element 20 and on which the magnetic shield cum electrode layer 42 is disposed. The insulating layer 52 made of a suitable insulating material such as $Al_2O_3$ is filled into the space between the first magnetic cum electrode 41 and the second magnetic shield cum electrode 42.

In this configuration, the sense current $I_s$ is conducted between the first magnetic cum electrode 41 and the second magnetic shield cum electrode 42. That is, the sense current $I_s$ flows along the lamination direction of the GMR element 20.

The example of FIG. 12 shows the case in which the magnetic sensing portion, i.e., the GMR element 20 is disposed in an opposing relation to the forward surface 80 which serves as a surface at which the GMR element 20 is brought in contact with or is opposed to the magnetic recording medium. In the case of the flying type magnetic head, for example, the magnetic sensing portion, i.e., the GMR element 20 is disposed in a facing relation to the ABS (air bearing surface).

Figure 13:
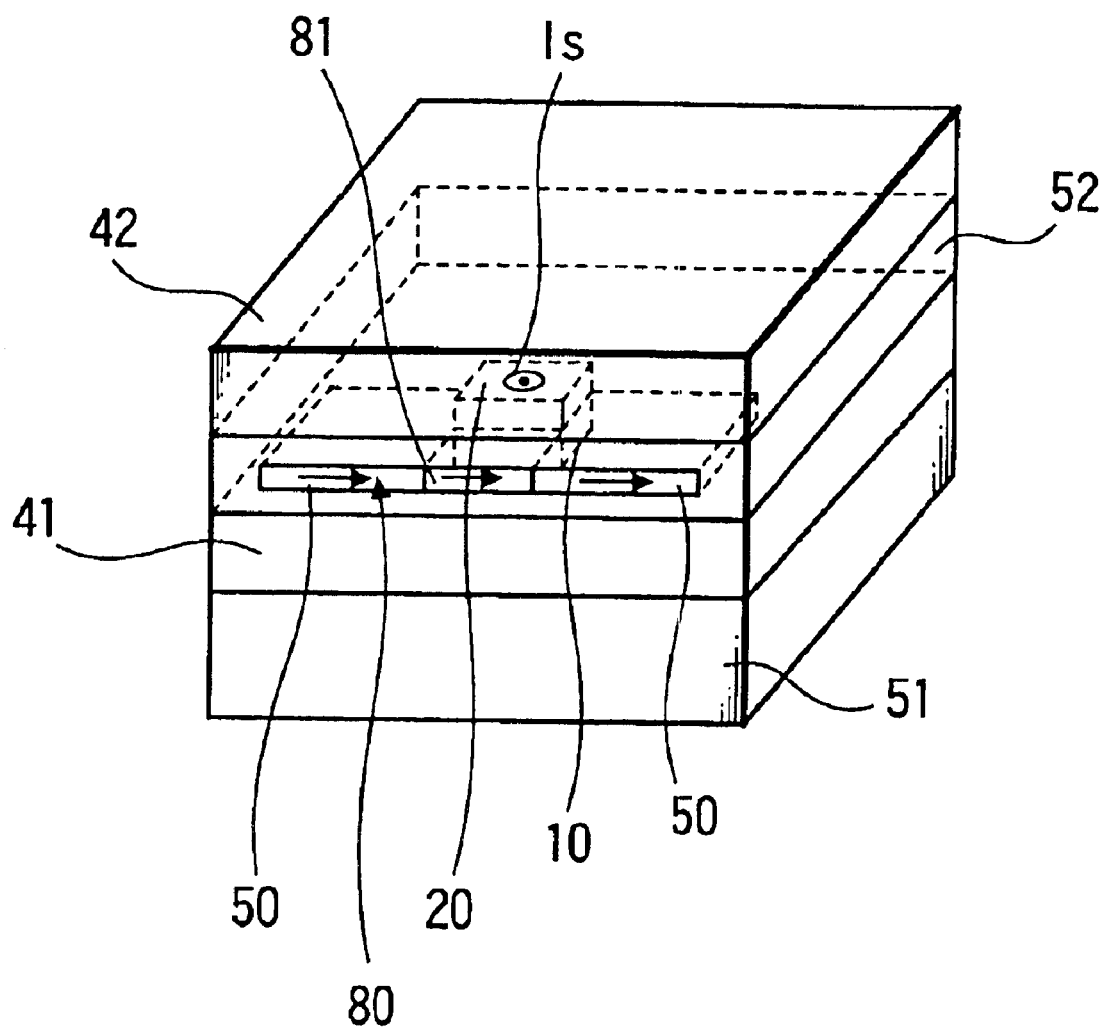
FIG. 13 is a cross-sectional perspective view illustrating further another example of a magnetic sensor or a magnetic head according to the present invention.

On the other hand, FIG. 13 is a schematic perspective view showing a further example of a magnetic head using magneto-resistive effect or a magnetic sensor having the aforementioned flux guide structure. As shown in FIG. 13, the GMR element 20 is disposed at the position retreated from the forward surface 80 in the depth direction, the flux guide layer 81, which is magnetically combined with the GMR element 20, is disposed in front of the GMR element 20 and the front end of the flux guide layer 81 is disposed in an opposing relation to the forward surface 80, whereby a magnetic field based upon recorded information from a magnetic recording medium is introduced into the magnetic head using magneto-resistive effect or the magnetic sensor.

Then, when the magnetic head using magneto-resistive effect or the magnetic sensor includes the above-mentioned magnetic flux guide structure, troubles such as friction heat or abrasion produced when the GMR element 20 is directly faced to the forward surface 80 can be avoided. Hence, the magnetic head using magneto-resistive effect or the magnetic sensor can be made highly reliable.

This magnetic flux guide layer 81 can be made of granular materials having a high magnetic permeability such as a CoFe film, an NiFe film, a CoFeB film having a soft magnetic property or lamination layer film of the above-mentioned films, e.g., CoFe/NiFe or CoFe/NiFe/CoFe or Co—Al—O or Fe—Al—O.

Although the magneto-resistive effect elements include the magnetic shield layers cum electrode layers 41 and 42 in the examples shown in FIGS. 12 and 13, the present invention is not limited thereto and electrodes and magnetic shield layers may be provided as separate components to thereby be laminated.

Since this magnetic head using magneto-resistive effect is a reproducing magnetic head, when a magnetic recording and reproducing head is constituted by this magnetic head using magneto-resistive effect, it is possible to constitute a recording and reproducing head by laminating a conventional magnetic induction type thin-film magnetic head on the second magnetic shield cum electrode layer 42 shown in FIGS. 12 and 13.

Figure 14:
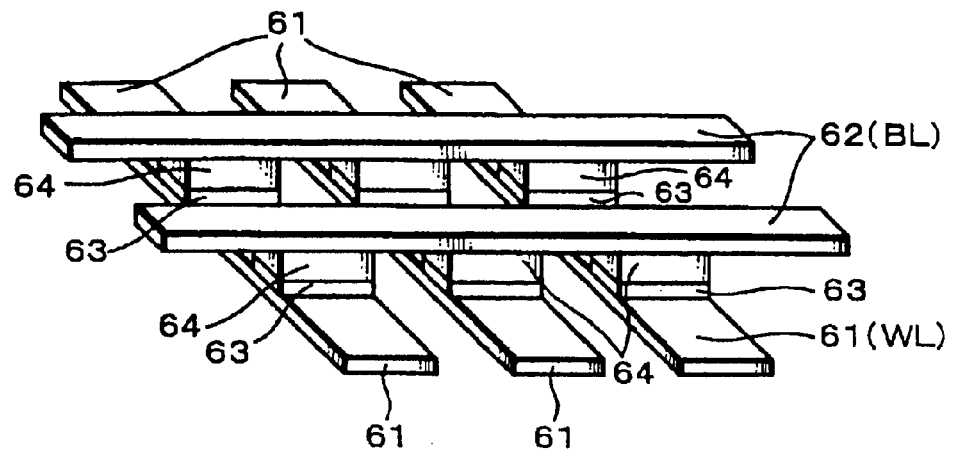
FIG. 14 is a perspective view illustrating a schematic configuration of a magnetic memory according to the present invention.
Figure 15:
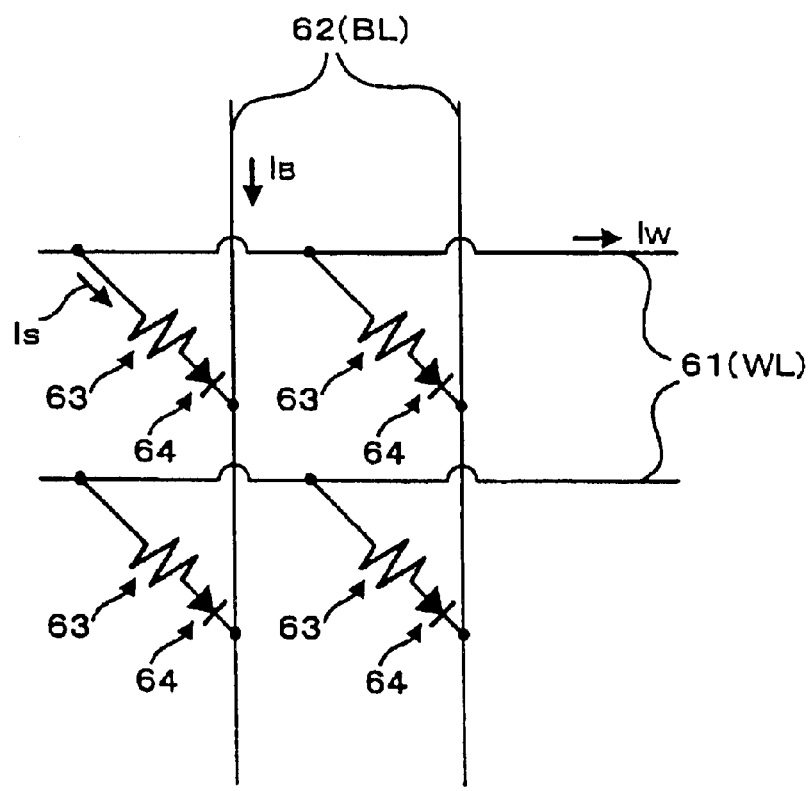
FIG. 15 is a schematic diagram showing an example of a circuit arrangement of a magnetic memory according to the present invention.

FIG. 14 is a perspective view showing a schematic arrangement of a magnetic memory 60 using the CPP type GMR element of the present invention according to an embodiment of the present invention. FIG. 15 is a diagram showing a circuit arrangement of such magnetic memory 60.

As illustrated, this magnetic memory 60 includes a memory cell disposed in response to an intersection point between a word line (WL) 61 and a bit line (BL) 62 and is comprised of a large number of memory cells arranged in a X-Y matrix fashion.

This memory cell includes a CPP type GMR element 63 and a diode 64 formed of an amorphous silicon film. The CPP type GMR element 63 and the diode 64 are disposed in series, the CPP type GMR element 63 is connected to the word line 61, and the diode 64 is connected to the bit line 62. The diode 64 restricts the current $I_s$, which flows through the CPP type GMR element 63, so that the current $I_s$ may flow from the word line 61 to the bit line 62.

According to the above-mentioned arrangement, the magnetization direction of the magnetization free layer of the CPP type GMR element 63 can be inverted by a synthesized magnetic field of a current magnetic field generated by a current $I_w$ flowing through the word line 61 and a current magnetic field generated by a current $I_B$ flowing through the bit line 62 and thereby this magnetization direction can be recorded as information on "1" or "0".

On the other hand, when recorded information is read out from the magnetic memory 60, the magnetization direction of the magnetization free layer, i.e., contents of information can be read out from the magnetic memory 60 based upon the magnitude of the sense current $I_s$ flowing through the CPP type GMR element 63 by effectively utilizing the giant magneto-resistive effect.

Although the magnetization direction of the magnetization free layer is inverted by applying the current magnetic fields of both the word line 61 and the bit line 62 to the selected memory cell, only any one of the current magnetic fields of the word line 61 and the bit line 62 is applied to a yet-to-be-selected memory cell, with the result that the magnetization direction cannot be inverted at all. As a consequence, information can be recorded on only a selected memory cell.

Next, embodiments of the GMR elements will be described.

[Embodiment 1]

In this embodiment, the GMR element had a fundamental configuration formed of the SV type GMR element having the synthetic configuration shown in FIG. 2A. On the first electrode 31, there was formed an underlayer (not shown) made of Ta having a thickness of 5 nm on which the lamination layer structure portion 10 was formed. Further, a protecting layer (not shown) similarly made of Ta having a thickness of 5 nm was disposed on this lamination layer structure portion 10. The film arrangement was Ta5/PtMn20/CoFe2/Ru0.9/CoFe2/Cu3/CoNiFe6/Ta 5. This written expression indicates the laminated states of the materials comprising the respective layers, and the symbol "/" shows the interface between the respective layers. Moreover, the respective numerical values show thicknesses (nm) of the respective layers, and this relationship applies for the following embodiments as well (see a sample 1 on the following table 1).

Then, in this fundamental configuration, the electric conduction restricting layer R was disposed on only the free layer 4, i.e., only the electric conduction restricting layer $R_{02}$ shown in FIG. 2B was disposed on the free layer 4, and this electric conduction restricting layer $R_{02}$ was constituted by $Co_{72}Fe_8B_{20}$ having a thickness of 1 nm (subscript numerals denote atomic percent).

Specifically, in this embodiment, a lamination layer structure of Ta5/PtMn20/CoFe2/Ru0.9/CoFe2/Cu3/CoNiFe6/Al—O 0.4/Ta5 was disposed between the first and second electrodes 31 and 32, each of which is made of Cu having a thickness of 300 nm (a sample 2 of the following table 1).

The lamination layer structure portion 10 having the above-mentioned configuration was annealed in the magnetic field of 10 kilooersteds at 270° C. for four hours.

An electrode layer having a thickness of 300 nm was deposited on both surfaces of this lamination layer structure portion 10.

Then, the resultant GMR element was patterned to the size of 0.1 $\mu$m×0.1 $\mu$m.

[Embodiments 2 to 4]

In these embodiments 2 to 4, the GMR element has a configuration similar to that of the embodiment 1, but its electric conduction restricting layer $R_{02}$ was comprised of Mg—O having a thickness of 0.5 nm (sample 3 on the following table 1), Ag—O having a thickness of 1 nm (sample 4 on the following table 1) and Y—O having a thickness of 1 nm (sample 5 on the following table 1).

According to this embodiment 5, in the configuration of the sample 1 having the above-mentioned structure shown in FIGS. 2A and 2B, Al—O having a thickness of 0.4 was formed under the first antiferromagnetic layer 1 as the electric conduction restricting layer $R_{01}$ (sample 6 on the following table 1).

According to this embodiment 6, in the configuration of the sample 1 having the above-mentioned structure shown in FIGS. 2A and 2B, Al—O having a thickness of 0.4 nm was formed at the central portion of the ferromagnetic layer 22 having the thickness of 2 nm as the electric conduction restricting layer $R_{22}$ (sample 7 on the following table 1).

[Embodiment 7]

According to this embodiment, in the configuration of the sample 1 having the above-mentioned structure shown in FIGS. 2A and 2B, Al—O having a thickness of 0.4 nm was formed at the central portion of the ferromagnetic layer 21 having the thickness of 2 nm (sample 8 on the following table 1).

The table 1 below shows measured the results of element resistances and amounts of resistance changes with respect to the above-mentioned respective samples 1 to 8.

TABLE 1

| Sample No. | Spin-valve film configuration (nm) | Element resistance (Ω) | Amount of resistance change (Ω) | Remarks |
|---|---|---|---|---|
| 1 | Ta5/PtMn20/CoFe2/Ru0.9/CoFe2/Cu3/CoNiFe6/Ta5 | 40 | 0.08 | comparative example |
| 2 | Ta5/PtMn20/CoFe2/Ru0.9/CoFe2/Cu3/CoNiFe6/Al-00.4/Ta5 | 40.5 | 2.30 | Inventive example |
| 3 | Ta5/PtNn20/CoFe2/Ru0.9/CoFe2/Cu3/CoNiFe6/Mg-00/Ta5 | 36.0 | 1.732 | Inventive example |
| 4 | Ta5/PtMn20/CoFe2/Ru0.9/CoFe2/Cu3/CoNiFe6/Ag-01/Ta5 | 28.3 | 1.448 | Inventive example |
| 5 | Ta5/PtMn20/CoFe2/Ru0.9/CoFe2/Cu3/CoNiFe6/Y-01/Ta5 | 32.5 | 1.624 | Inventive example |
| 6 | Ta5/A1-00.4/PtMn20/CoFe2/Ru0.9/CoFe2/Cu3/CoNiFe6/Ta5 | 42.5 | 1.700 | Inventive example |
| 7 | Ta5/PtMn20/CoFe2/Ru0.9/CoFe1/A1-00.4/CoFe1/Cu3/CoNiFe6/Ta5 | 41.0 | 1.670 | Inventive example |
| 8 | Ta5/PtMn20/CoFe1/A1-00.4/CoFe1/Ru0.9/CoFe2/Cu3/CoNiFe6/Ta5 | 41.3 | 1.584 | Inventive example |

As is clear from the above-mentioned table 1, it is to be understood that the samples 2 to 8 of the present invention have increased the amounts of resistance changes considerably as compared with the sample 1 in which the electric conduction restricting layer is not provided.

Accordingly, when the magnetic sensor and the magnetic head using magneto-resistive effect are made up by using the inventive SV type GMR element having an large amount of resistance change, detection of the external magnetic field can be obtained as a large detected output or a large reproduced output.

Further, when the magnetic memory is made up by using the inventive SV type GMR element, a stable operation of the magnetic memory can be ensured.

As a requirement for designing a magnetic head, a large amount of resistance change dR has to be enumerated. In order to improve the amount of resistance change dR, it is necessary to increase the resistance change of the SV type GMR element or to increase MR (magneto-resistance) ratio.

In inserting the electric conduction restricting into the magneto-resistive effect element, the MR ratio of this magneto-resistive effect element exhibited, without the MR ratio (dR/R) being lowered, a value equal to that of the SV type GMR element into which the electric conduction restricting layer was not inserted. Accordingly, since the element resistance was increased by inserting the electric conduction restricting layer into the magneto-resistive effect element, the dR value was increased.

Although not less than one layer of electric conduction restricting layer, for example, a plurality of electric conduction restricting layers may be inserted into the magneto-resistive effect element as mentioned before, when the sum total of the thicknesses of the electric conduction restricting layers becomes larger than 5 nm in the size of 0.1 $\mu$m×0.1 $\mu$m, the element resistance increases too much. As a consequence, when a necessary sense current flows through the magneto-resistive effect element, the magneto-resistive effect element unavoidably produces intensive heat so that the magneto-resistive effect is degraded and noises are increased. Therefore, in the above-mentioned size of 0.1 $\mu$m×0.1 $\mu$m, for example, it is to be desired that the element resistance should be less than 70Ω, i.e., less than 70Ω×0.1 $\mu$m×0.1 $\mu$m=0.7Ω·$\mu$m$^2$.

Although the SV type GMR element of the CPP type according to the present invention has the CPP configuration as described above, this SV type GMR element can increase the element resistance and the amount of resistance change can be improved while the ratio of resistance change is being held.

The magneto-resistive effect element, the magnetic sensor using magneto-resistive effect, the magnetic head using magneto-resistive effect and the magnetic memory according to the present invention are not limited to the above-mentioned examples, and can be variously modified in the configurations of the present invention in accordance with objects and modes in which they are in use.

According to the present invention, since the element resistance, which was decreased when the magneto-resistive effect element is formed as the CPP configuration, can be compensated for and the high element resistance can be obtained so that the amount of resistance change can be increased, there can be constructed the magneto-resistive effect element, the magnetic sensor using magneto-resistive effect and the magnetic head using magneto-resistive effect which can increase the recording density and which can microminiaturize recording and reproducing bits, accordingly, which can read out signals from these microminiaturized areas at high sensitivity when they are applied to a long-time moving picture processing.

Furthermore, the magnetic memory also is able to increase recording density and can become high in accuracy.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A magneto-resistive effect element, said magneto-resistive effect element being a giant magneto-resistive effect element, comprising:

a lamination layer structure portion having at least a free layer the magnetization of which is rotated in response to an external magnetic field, a fixed layer, an antiferromagnetic layer for fixing the magnetization of said fixed layer and a nonmagnetic layer interposed between said free layer and said fixed layer, wherein a sense current flows to substantially a lamination layer direction of said lamination layer structure portion, and said lamination layer structure portion has disposed thereon an electric conduction restricting layer in which very small electric conduction areas are dispersedly formed across a path of said sense current, and wherein said electric conduction restricting layer is one of a plurality of electric conduction restricting layers disposed at other positions than at an interface of the layers constituting said lamination layer structure portion.

2. A magneto-resistive effect element according to claim 1, wherein said electric conduction restricting layer is disposed at not less than any one of the inside of said free layer, the surface of said free layer as is opposite to a surface at which it is bonded to said nonmagnetic layer, the inside of said ferromagnetic layer constituting said fixed layer, the inside of said antiferromagnetic layer and the surface of said ferromagnetic layer as is opposite to a surface at which it is bonded to said fixed layer.

3. A magneto-resistive effect element according to claim 1, wherein said very small electric conduction areas of said electric conduction restricting layer are one of pin-holes or net-like areas.

4. A magneto-resistive effect element according to claim 1, wherein said free layer of said lamination layer structure portion includes a flux guide structure in which said free layer is magnetically combined to a flux guide layer and said electric conduction restricting layer is disposed inside said flux guide layer.

5. A magneto-resistive effect element according to claim 1, wherein said free layer of said lamination layer structure portion includes a flux guide structure in which said free layer is magnetically combined to a flux guide layer and said electric conduction restricting layer is disposed on the surface of said free layer as is opposite to a surface of said flux guide layer.

6. A magneto-resistive effect element according to claim 1, wherein said free layer of said lamination layer structure portion includes a flux guide structure in which said free layer is magnetically combined to a flux guide layer and said electric conduction restricting layer is disposed inside said flux guide layer and another electric conduction restricting layer is disposed on the surface of said free layer as is opposite to a surface of said flux guide layer.

7. A magnetic sensor using magneto-resistive effect including a magneto-resistive effect element, said magneto-resistive effect element being a giant magneto-resistive effect element including a lamination layer structure portion having at least a free layer the magnetization of which is rotated in response to an external magnetic field, a fixed layer, an antiferromagnetic layer for fixing the magnetization of said fixed layer and a nonmagnetic layer interposed between said free layer and said fixed layer and in which a sense current flows to substantially a lamination layer direction of said lamination layer structure portion, wherein said lamination layer structure portion has disposed thereon an electric conduction restricting layer in which very small electric conduction areas are dispersedly formed across a path of said sense current, and wherein said very small electric conduction areas of said electric conduction restricting layer are one of pin-holes or net-like areas.

8. A magnetic sensor using magneto-resistive effect according to claim 7, wherein the layer in which said electric conduction restricting layer is formed is disposed at other positions than at an interface between the layers of said lamination layer structure portion.

9. A magnetic sensor using magneto-resistive effect according to claim 7, wherein said electric conduction restricting layer is disposed at one of the inside of said free layer, the surface of said free layer as is opposite to surface at which it is bonded to said nonmagnetic layer, the inside of said ferromagnetic layer comprising said fixed layer, the inside of said antiferromagnetic layer and the surface of said antiferromagnetic layer as is opposite to a surface at which it is bonded to said fixed layer.

10. A magnetic sensor using magneto-resistive effect according to claim 7, wherein said free layer of said lamination layer structure portion includes a flux guide structure in which said free layer is magnetically combined to a flux guide layer and said electric conduction restricting layer is disposed inside said flux guide layer.

11. A magnetic head using magneto-resistive effect according to claim 7, wherein said free layer of said lamination layer structure portion includes a flux guide structure in which said free layer is magnetically combined to a flux guide layer and said electric conduction restricting layer is disposed on the surface of said flux guide layer as is opposite to a surface of said free layer.

12. A magnetic sensor using magneto-resistive effect according to claim 7, wherein said free layer of said lamination layer structure portion includes a flux guide structure in which said free layer is magnetically combined to a flux guide layer and said electric conduction restricting layer is disposed inside said flux guide layer and another electric conduction restricting layer is disposed on the surface of said flux guide layer as is opposite to a surface of said free layer.

13. A magnetic head using magnet-resistive effect in which a magneto-resistive effect element is disposed between first and second magnetic shields, said magneto-resistive effect element being a giant magneto-resistive effect element including a lamination layer structure portion in which at least a free layer the magnetization of which is rotated in response to a external magnetic field, a fixed layer, an antiferromagnetic layer for fixing the magnetization of said fixed layer and a nonmagnetic layer interposed between said free layer and said fixed layer are laminated and in which a sense current flows to substantially a lamination layer direction of said lamination layer structure portion, wherein said lamination layer structure portion has disposed thereon an electric conduction restricting layer in which very small electric conduction areas are dispersedly formed across a path of said sense current, wherein said very small electric conduction areas of said electric conduction restricting layer are one of pin-holes or net-like areas.

14. A magnetic head using magneto-resistive effect according to claim 13, wherein said electric conduction restricting layer is disposed at other positions than at an interface between the layers constituting said lamination layer structure portion.

15. A magnetic head using magneto-resistive effect according to claim 13, wherein said electric conduction restricting layer is disposed at one of the inside of said free layer, the surface of said free layer as is opposite to a surface at which it is bonded to said nonmagnetic layer, the inside of said ferromagnetic layer constituting said fixed layer, the inside of said antiferromagnetic layer and the surface of said antiferromagnetic layer as is opposite to a surface at which it is bonded to said fixed layer.

16. A magnetic head using magneto-resistive effect according to claim 13, wherein said free layer of said lamination layer structure portion includes a flux guide structure in which said free layer is magnetically combined to a flux guide layer and said electric conduction restricting layer is disposed inside said flux guide layer.

17. A magnetic head using magneto-resistive effect according to claim 13, wherein said free layer of said lamination layer structure portion includes a flux guide structure in which said free layer is magnetically combined to a flux guide layer and said electric conduction restricting layer is on the surface of said flux guide layer as is opposite to a surface of said free layer.

18. A magnetic head using magneto-resistive effect according to claim 13, wherein said free layer of said lamination layer structure portion includes a flux guide structure in which said free layer is magnetically combined to a flux guide layer and said electric conduction restricting layer is disposed inside said flux guide layer and another electric conduction restricting layer is disposed on the surface of said flux guide layer as is opposite to a surface of said free layer.

19. A magnetic memory comprising:
a bit line;
a word line; and
a memory element disposed in response to an intersection at which said bit line and said word line cross each other, wherein
said memory element is comprised of a giant magneto-resistive effect element including a lamination layer structure portion in which at least a free layer the magnetization of which is rotated in response to an external magnetic field, a fixed layer, an antiferromagnetic layer for fixing the magnetization of said fixed layer and a nonmagnetic layer interposed between said free layer and said fixed layer are laminated and in which
a sense current flows to substantially a lamination layer direction of said lamination layer structure portion and said lamination layer structure portion has disposed thereof an electric conduction restricting layer in which very small electric conduction areas are dispersedly formed across a path of said sense current,
wherein said very small electric conduction areas of said electric conduction restricting layer are one of pinholes or net-like areas.

20. A magnetic memory according to claim 19, wherein said electric conduction restricting layer is disposed at other positions than at an interface between the layers of said lamination layer structure portion.

21. A magnetic memory according to claim 19, wherein said electric conduction restricting layer is disposed at one of the inside of said free layer, the surface of said free layer as is opposite to a surface at which it is bonded to said nonmagnetic layer, the inside of said ferromagnetic layer comprising said fixed layer, the inside of said antiferromagnetic layer and the surface of said antiferromagnetic layer as is opposite to a surface at which it is bonded to said fixed layer.

* * * * *